(12) United States Patent
Schulze

(10) Patent No.: US 11,419,227 B2
(45) Date of Patent: Aug. 16, 2022

(54) HOUSING FOR RECEIVING AN ELECTRICAL OR ELECTRONIC FUNCTIONAL ASSEMBLY

(71) Applicant: Phoenix Contact GmbH & Co. KG, Blomberg (DE)

(72) Inventor: Volker Schulze, Blomberg (DE)

(73) Assignee: Phoenix Contact GmbH & Co. KG, Blomberg (DE)

( * ) Notice: Subject to any disclaimer, the term of this patent is extended or adjusted under 35 U.S.C. 154(b) by 0 days.

(21) Appl. No.: 16/493,807

(22) PCT Filed: Mar. 20, 2018

(86) PCT No.: PCT/EP2018/057035
§ 371 (c)(1),
(2) Date: Sep. 13, 2019

(87) PCT Pub. No.: WO2018/172363
PCT Pub. Date: Sep. 27, 2018

(65) Prior Publication Data
US 2020/0015376 A1     Jan. 9, 2020

(30) Foreign Application Priority Data
Mar. 21, 2017   (BE) .................................. 2017/5180

(51) Int. Cl.
*H05K 5/02*      (2006.01)
*H05K 5/00*      (2006.01)
*H05K 5/03*      (2006.01)

(52) U.S. Cl.
CPC ......... *H05K 5/0217* (2013.01); *H05K 5/0008* (2013.01); *H05K 5/0204* (2013.01); *H05K 5/03* (2013.01)

(58) Field of Classification Search
CPC .. H05K 5/0004; H05K 5/0008; H05K 5/0204; H05K 5/0217; H05K 5/0234; H05K 5/03
See application file for complete search history.

(56) References Cited

U.S. PATENT DOCUMENTS 5,848,718 A * 12/1998 Colwell ................. H02G 3/081
220/4.02
10,104,795 B2 * 10/2018 Liebert .................. H05K 5/061
(Continued)

FOREIGN PATENT DOCUMENTS

DE          4215041 A1    11/1992
DE          4240754 A1 * 6/1994 ........... H05K 5/0043
(Continued)

OTHER PUBLICATIONS

Translated Description DE4205041A1, 6 pages (Year: 1992).*
(Continued)

*Primary Examiner* — Andrew M Roersma
(74) *Attorney, Agent, or Firm* — Leydig, Voit & Mayer, Ltd.

(57) ABSTRACT

A housing for receiving an electrical or electronic functional module includes: a first housing element having a first surface section and at least one first connecting section arranged on the first surface section; a second housing element having a second surface section and at least one second connecting section arranged on the second surface section, the first housing element and the second housing element being connectable to each other via the at least one first connecting section and the at least one second connecting section; and an intermediate element arrangeable between the at least one first connecting section and the at least one second connecting section in order to connect the first housing element and the second housing element, the intermediate element having at least one functional device
(Continued)

for providing an additional function independent of the connection of the at least one first connecting section.

8 Claims, 12 Drawing Sheets

(56) References Cited

U.S. PATENT DOCUMENTS

| | | | |
|---|---|---|---|
| 10,939,566 B2 * | 3/2021 | Best | ................ H05K 5/0008 |
| 2007/0114194 A1 | 5/2007 | Luo et al. | |

FOREIGN PATENT DOCUMENTS

| | | | | |
|---|---|---|---|---|
| DE | 29723154 U1 | 10/1998 | | |
| DE | 19811727 A1 | 9/1999 | | |
| DE | 20004261 U1 | 1/2001 | | |
| DE | 102014207039 A1 | 10/2014 | | |
| EP | 0078405 A2 * | 5/1983 | ........... H05K 5/0008 |
| FR | 2725311 A1 | 4/1996 | | |
| FR | 2888710 A1 * | 1/2007 | ........... H05K 5/0204 |
| JP | H 05191057 A | 7/1993 | | |
| JP | 2005150170 A | 6/2005 | | |
| JP | 2010238690 A * | 10/2010 | ........... H05K 5/0217 |

OTHER PUBLICATIONS

Translated Description DE29723154U1, 8 pages (Year: 1998).*
Translated Description DE102014207039A1, 14 pages (Year: 2014).*
Translated Description JP2005150170A, 23 pages (Year: 2005).*
Translated Description JPH05191057A, 7 pages (Year: 1993).*

* cited by examiner

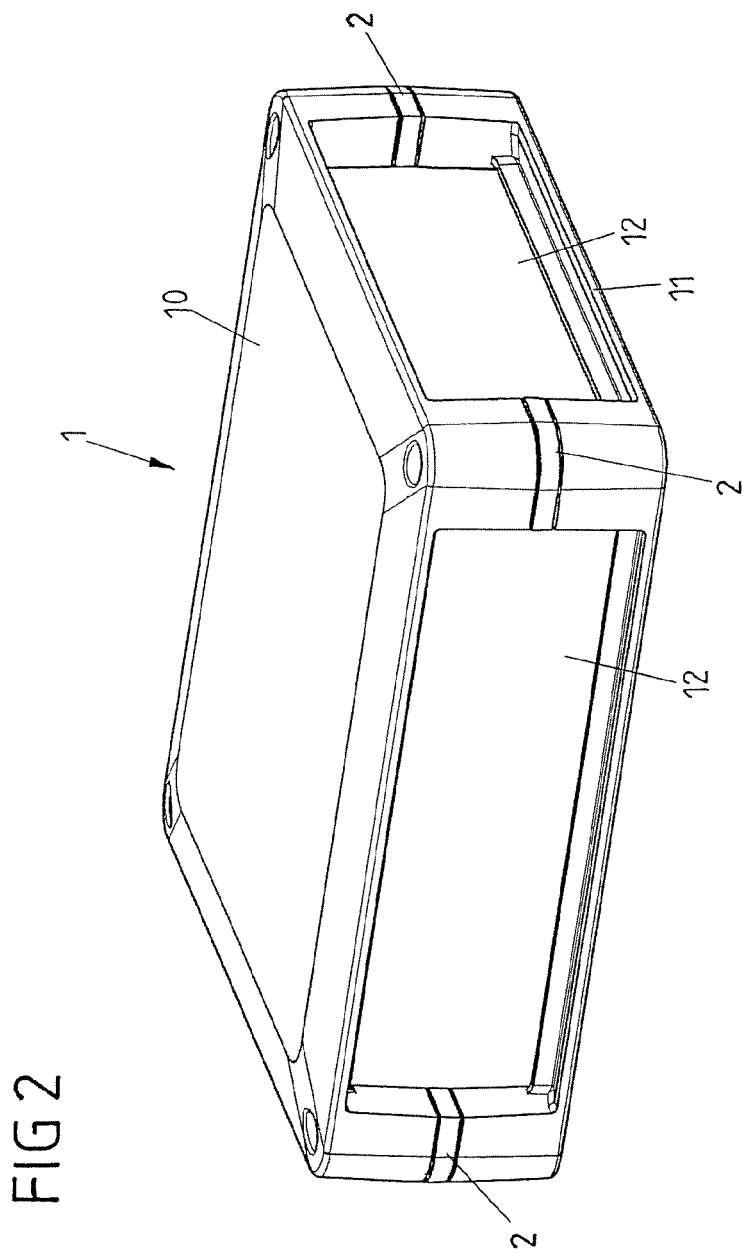

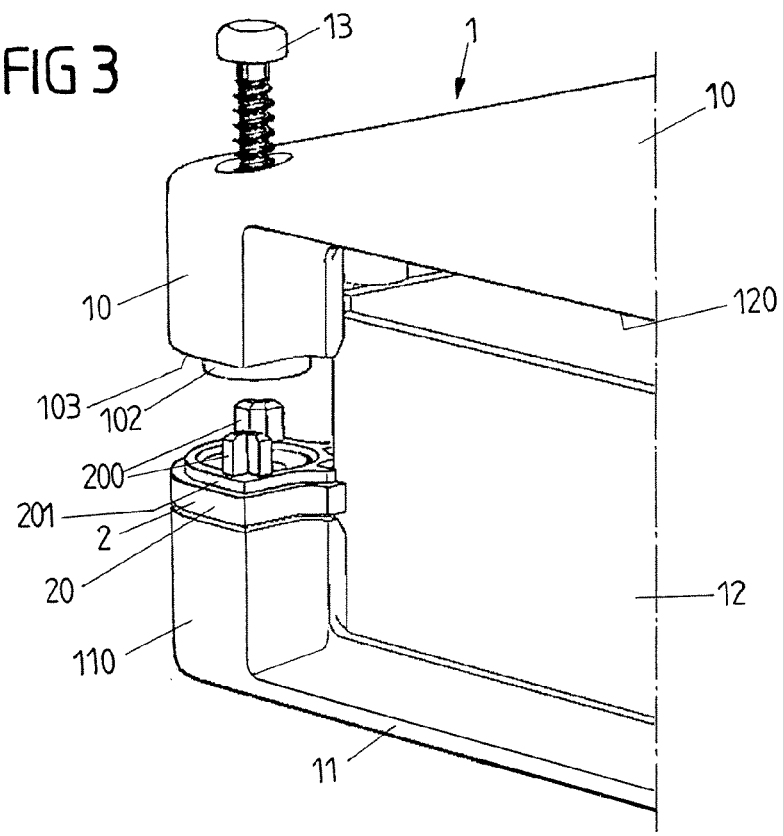
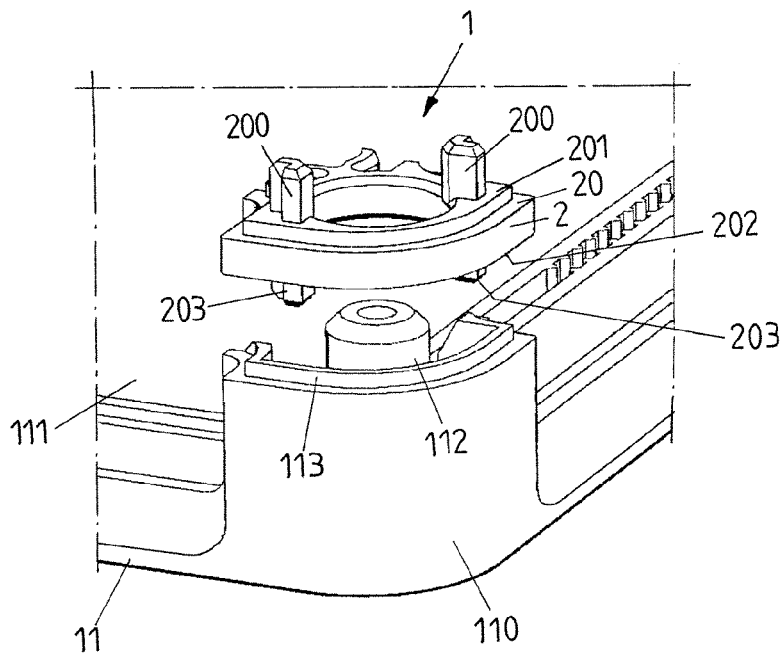

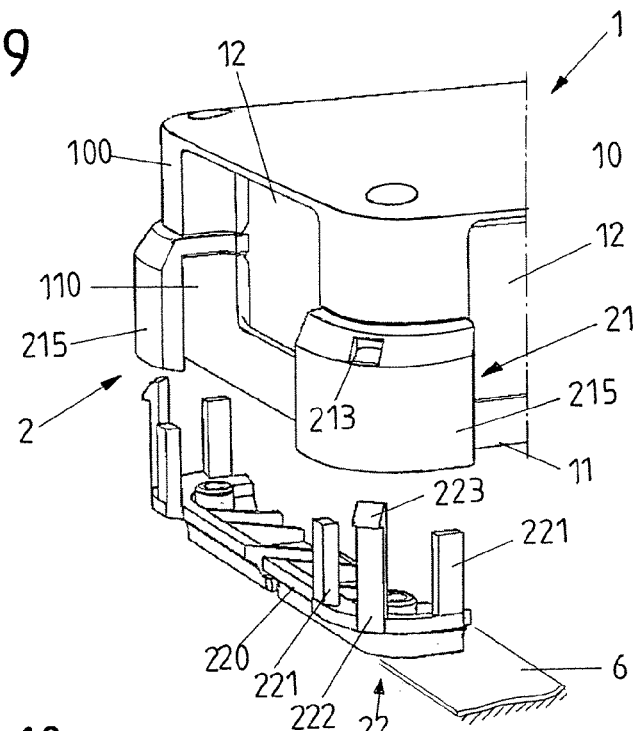
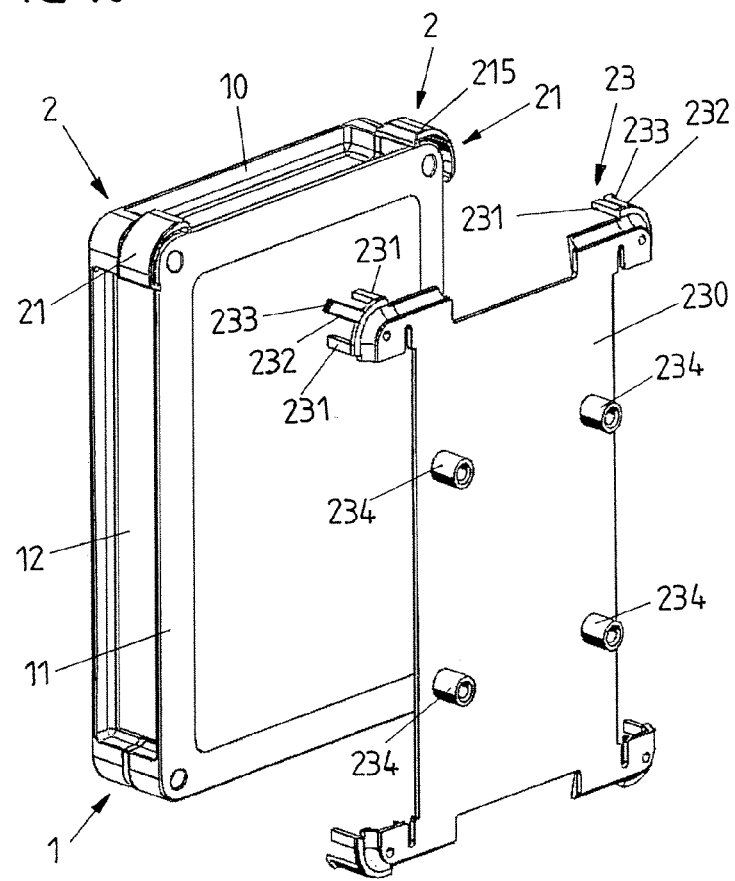

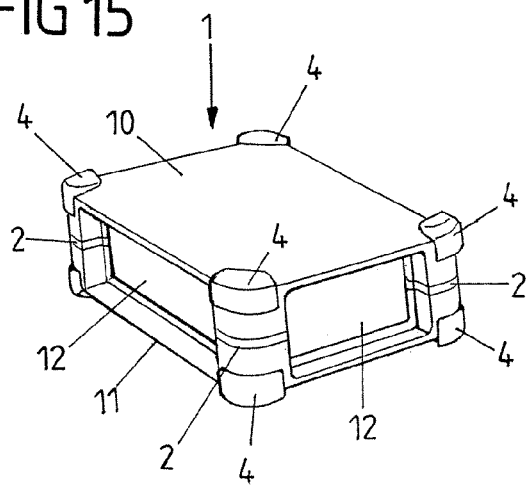
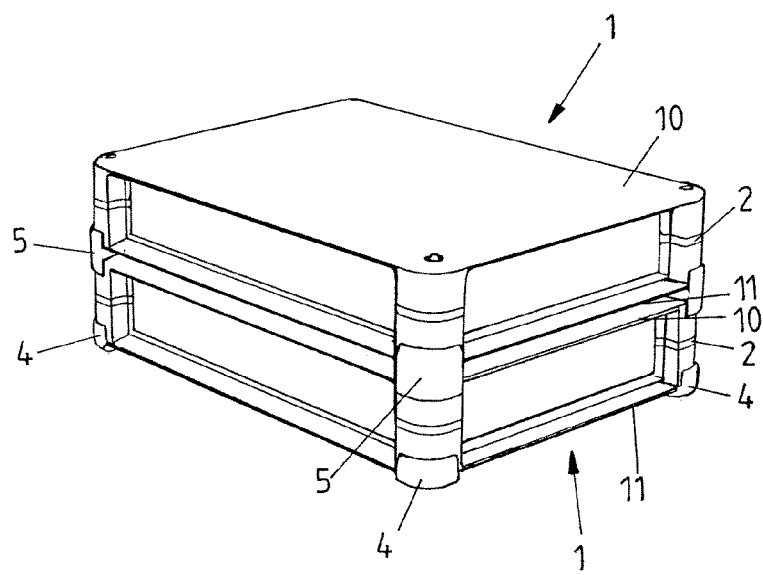
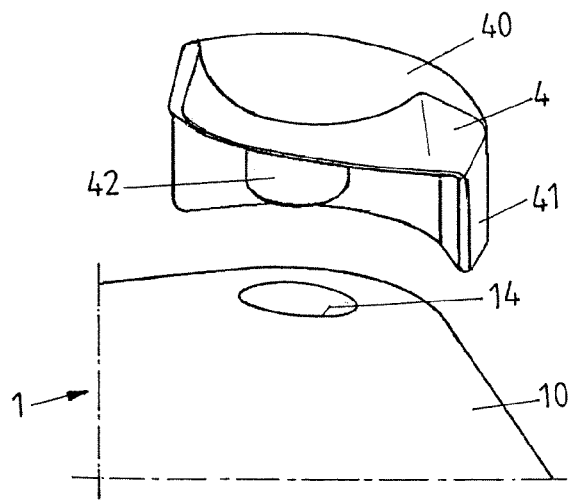

HOUSING FOR RECEIVING AN ELECTRICAL OR ELECTRONIC FUNCTIONAL ASSEMBLY

CROSS-REFERENCE TO PRIOR APPLICATIONS

This application is a U.S. National Phase application under 35 U.S.C. § 371 of International Application No. PCT/EP2018/057035, filed on Mar. 20, 2018, and claims benefit to Belgian Patent Application No. BE 2017/5180, filed on Mar. 21, 2017. The International Application was published in German on Sep. 27, 2018 as WO/2018/172363 under PCT Article 21(2).

FIELD

The invention relates to a housing for receiving an electrical or electronic functional module.

BACKGROUND

A housing of this type comprises a first housing element which has a first surface section and at least one first connecting section arranged on the first surface section, and a second housing element which has a second surface section and at least one second connecting section arranged on the second surface section, wherein the first housing element and the second housing element can be connected to each other via the at least one first connecting section and the at least one second connecting section.

The housing can in particular be designed to accommodate a printed circuit board (also referred to as a circuit board) with which, for example, an electronic computer device, for example a so-called "single-board computer," is realized. In the case of such a single-board computer, a computer device is completely accommodated on a single circuit board which can be enclosed in the housing in order in this way to provide a computer device of compact design.

However, the housing can be used on a modular basis for receiving other electrical or electronic devices. The housing can be designed, for example, to be mounted on a support rail or in a switchgear cabinet of an industrial installation so that an electrical or electronic device enclosed in the housing can be combined with other modules in order to create a device which can take over, for example, controlling or evaluating functions within the framework of an industrial installation.

The housing elements can, for example, be implemented as housing halves that can be attached to each other in order to enclose an electrical or electronic functional module in the housing. In this case, the electrical or electronic functional module is fastened beforehand to one of the housing halves so that the housing can be closed by joining together the housing halves and the functional module can be enclosed in the housing.

In a housing known from DE 200 04 261 U1, housing parts are to be attached to each other in order to produce the housing, the housing having on one side a front panel which is enclosed between the housing parts.

US 2007/0114194 A1 discloses a fastening device by means of which a printed circuit board can be fixed to a housing element of a housing.

DE 198 11 727 A1 discloses another fastening device in which a first pair of cross-members is to be fixed to a housing element. A second pair of cross-members is adjustably guided on the first pair of cross-members by means of supports. A functional module, for example in the form of a printed circuit board, can be fixed to the second pair of cross-members.

Such a housing should be flexibly populatable with electrical or electronic functional modules and, with electrical or electronic functional modules enclosed therein, should be able to be used variably in a wide variety of environments and for a wide variety of purposes. It should accordingly be possible to arrange such a housing in, for example, a switchgear cabinet within the framework of an industrial installation, wherein, for example, electrical lines are to be routed to the housing in order to, for example, connect to a power supply an electrical or electronic functional module enclosed in the housing or to route data lines to the electrical or electronic functional module.

In this case, it may be desirable to be able to assemble the housing flexibly in the manner of a modular system in order to adapt the housing to a desired use.

SUMMARY

In an embodiment, the present invention provides a housing for receiving an electrical or electronic functional module, comprising: a first housing element having a first surface section and at least one first connecting section arranged on the first surface section; a second housing element having a second surface section and at least one second connecting section arranged on the second surface section, the first housing element and the second housing element being connectable to each other via the at least one first connecting section and the at least one second connecting section; and an intermediate element arrangeable between the at least one first connecting section and the at least one second connecting section in order to connect the first housing element and the second housing element, the intermediate element having at least one functional device configured to provide an additional function independent of the connection of the at least one first connecting section and the at least one second connecting section.

BRIEF DESCRIPTION OF THE DRAWINGS

The present invention will be described in even greater detail below based on the exemplary figures. The invention is not limited to the exemplary embodiments. Other features and advantages of various embodiments of the present invention will become apparent by reading the following detailed description with reference to the attached drawings which illustrate the following:

FIG. 2 shows a view of the housing in the assembled state;

FIG. 3 shows an enlarged view of the housing in the region of a corner, with an intermediate element arranged between connecting sections in the form of struts of two housing elements;

FIG. 4 shows an enlarged view of an intermediate element on a connecting section;

FIG. 9 shows a view of the housing before the housing is attached to a fastening element;

FIG. 10 shows a view of a housing prior to attachment to another fastening element for fastening the housing to a wall, for example, a device wall or a switchgear cabinet wall;

FIG. 15 shows a view of a housing having corner elements at the corners of the housing;

FIG. 16 shows a view of housings connected to each other via corner elements;

FIG. 17 shows a view of a housing in the region of a corner with a corner element to be arranged thereon;

DETAILED DESCRIPTION

Figure 1:
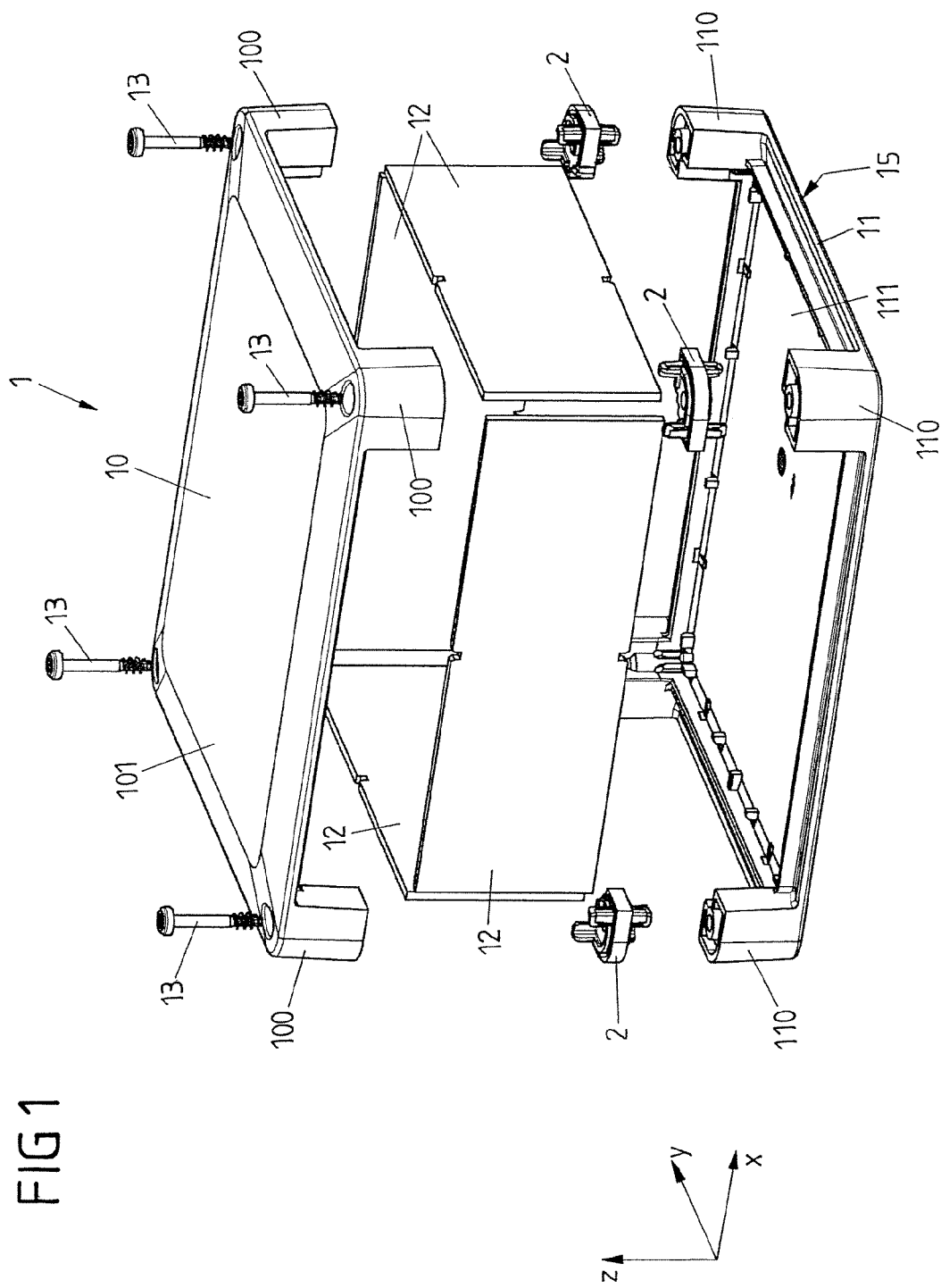
FIG. 1 shows a view of a housing assembled from a plurality of housing elements.

In an embodiment, the present invention provides a housing which can be adapted in a variable manner for different purposes.

Accordingly, an intermediate element is provided which can be arranged between the at least one first connecting section and the at least one second connecting section in order to connect together the first housing element and the second housing element, wherein the intermediate element has at least one functional device for providing an additional function independent of the connection of the at least one first connecting section and the at least one second connecting section.

It is conceivable and possible to provide the housing as part of a modular system. In this way, for example, the first housing element and the second housing element can be provided as identical parts and can be implemented as housing halves which are of identical construction and can be attached to each other for mounting the housing. In this case, the housing elements are connected via connecting sections provided on the housing elements, the housing elements being attached to each other with the interposition of one or more intermediate elements such that each intermediate element comes to lie between a first connecting section on the side of the first housing element and a second connecting section on the side of the second housing element.

For example, while the housing elements may be designed as identical parts, different housings having different intermediate elements may be used to adapt the housing for a particular function or use. In this case, particular functions can be made available on the housing via the intermediate elements in order, for example, to enable the housing to be fastened to a wall, for example a device wall or a switchgear cabinet wall, in order to fix components, for example electrical lines, to the housing in order to arrange a carrying means on the housing or in order to provide a completely different function on the housing.

The intermediate element having at least one functional device for providing an additional function independent of the connection of the at least one first connecting section and the at least one second connecting section should be understood in the present case as the functional device of the intermediate element not being used for connecting the connecting sections of the housing elements to each other but rather providing another function independent of this connection. The functional device thus does not have a connecting function for connecting the housing elements to each other but provides a different function beyond this connection.

The at least one first connecting section of the first housing element can be formed, for example, by a first strut projecting from the first surface section. It is also conceivable and possible for the at least one second connecting section of the second housing element to be formed by a second strut projecting from the second surface section. The struts can be attached to each other and connected to each other by a fastening element in the form of a screw engaging from one strut into the other strut, for example.

In one specific embodiment, the housing elements can, for example, each have a rectangular basic shape with rectangular surface sections. Connecting sections in the form of struts are in this case arranged at the corners of the surface sections and can be attached to each other for assembling the housing elements and connected to each other by means of fastening elements in the form of screws engaging in each case from one strut into the other strut, for example. The housing elements can be manufactured identically, for example as plastic injection-molded parts, so that identical parts are used for the housing elements and thus an inexpensive, simple production of the housing using identical parts results.

In order to close off the side walls of the housing, panel elements can additionally be provided which are held between the housing elements by interlocking when the housing elements are assembled. In this case, the panel elements can, for example, take the form of plastic parts or even metal parts, wherein openings for attaching plug-in connectors to the housing, for example, can be provided in the panel elements. The panel elements can thus be adapted for a specific electrical or electronic functional module enclosed in the housing in order, for example, to connect electrical lines to the electrical or electronic functional module.

In principle, a plurality of functions which can be made available via the functional device of the intermediate element are conceivable and possible. In this regard, the different functions described below are to be understood merely as examples.

For example, the functional device can provide a mounting device for fastening the housing to a wall. The functional device arranged on the intermediate element thus makes it possible to fix the housing to a wall, for example a device wall or a switchgear cabinet wall. Since the mounting device is provided on the intermediate element, adjustments in particular to the housing elements of the housing are not necessary. The mounting function can be provided by means of one or more intermediate elements which come to lie between the connecting sections of the housing elements.

In an alternative embodiment, a cover element for covering a housing opening can also be provided via the functional device. The intermediate element is thus connected, for example, to a wall section which, when the housing is mounted, covers a housing opening in order to provide dust protection, for example.

Alternatively, the functional device can form a fastening device for fixing at least one component to the housing. For example, so-called strain relief can be provided via the functional device, by means of which one or more electrical lines can be fixed to the housing in such a way that tensile forces acting on the electrical lines can be absorbed and conducted away via the fastening device.

The intermediate element has, for example, a body which can be arranged between the at least one first connecting section and the at least one second connecting section. The body of the intermediate element is thus accommodated between the first connecting section and the second connecting section of the housing elements, it being conceivable and possible to provide further spacer elements between the connecting sections so that, for example, the intermediate element on one side bears with its body on the first connecting section of the first housing element and on the other side is connected to a spacer element supported on the second connecting section of the second housing element.

The body of the intermediate element can preferably be connected by interlocking to the at least one first connecting section and/or to the at least one second connecting section. Provided for this purpose on the body of the intermediate element may, for example, be pins which project from the body and can engage in associated recesses on the part of the first connecting section of the first housing element or of the second connecting section of the second housing element in order to fix the body of the intermediate element by interlocking to the first connecting section or the second connecting section. The housing can thus be mounted in a simple manner in that the intermediate element with its body is attached on one side to the first connecting section and on the other side to the second connecting section in order in this way to join the housing elements together. By fixing the housing elements to each other, for example using fastening elements in the form of screws, the housing is then mounted without the need for additional, separate assembly steps for fixing the intermediate elements between the connecting sections of the housing elements.

If the functional device takes the form of a mounting device, a skirt can, for example, be arranged on the body of the intermediate element, which skirt extends from the body of the intermediate element in the direction of the first surface section or in the direction of the second surface section. For example, the skirt may in sections externally cover the first connecting section and/or the second connecting section, to which the intermediate element is attached, so that the skirt extends on the outside of the connecting sections toward the first surface section of the first housing element or toward the second surface section of the second housing element.

A mounting feature for the housing can be provided via the skirt. In this way, a fastening flange can project outwardly from the skirt, on which flange a fastening point is arranged, by means of which the housing can be fixed, for example, to a wall, for example a wall of a switchgear cabinet or a device wall. The housing can, for example, be screwed to the wall via the fastening point.

For example, if a hidden attachment of the housing to a wall is to be provided, provision can also be made for the skirt to be connected to a fastening element by interlocking. The fastening element can, for example, be attached to the wall in such a way that the housing can be fixed to the wall by plugging the skirt onto the fastening element. For this purpose, for example, one or more latching pins can be arranged on the fastening element, which latching pins can be connected in a latching manner to the skirt, for example to a latch opening provided on the skirt.

If the functional device forms a cover element, the functional device can, for example, have a housing wall which extends from the body of the intermediate element and is formed, for example, in one piece with the body. The housing wall is fixedly connected to the body and is fixed to the housing by mounting the intermediate element between the connecting sections of the housing elements. For example, a housing opening is closed off by means of the housing wall so that the housing is, for example, protected from dust or moisture.

In an advantageous embodiment, when the functional device takes the form of a cover element, the housing wall can, for example, respectively be connected on opposite sides to a body of an intermediate element that can be arranged between a first connecting section and a second wall section. A fastening of the housing wall on both sides between the housing elements can thus be effected via the two bodies of two intermediate elements so that the housing wall is reliably fixed between the housing elements.

If the functional device is designed as a fastening device for fastening a component, for example an electrical line, to the housing, the fastening device can have, for example, a fastening body which is connected to the body of the intermediate element and which is, for example, formed integrally with the body and to which at least one electrical line can be fastened. In this case, the fastening device can provide strain relief, for example. Electrical lines can be clamped to the fastening body by using suitable fastening elements so that tensile forces acting on the electrical lines cannot cause the electrical lines to loosen from the housing.

In this case, too, it is conceivable and possible for the fastening body to respectively be connected on both sides to a body of an intermediate element in order in this way to provide a double-sided fastening of the fastening body between the housing elements.

Other functional devices for providing other functions are conceivable and possible. For example, a functional device of an intermediate element can also provide a carrying means with, for example, a pivotable carrying handle, by which the housing can be grasped and carried by hand by a user. In this case, for example, a hinged connection can be arranged on the body of the intermediate element, by means of which a carrying handle can be arranged in a hinged manner on the body of the intermediate element.

It is also conceivable and possible to use further elements on the housing in order to provide further functions. Corner elements, which provide a defined support for the housing and additionally provide impact protection in order, for example, to absorb impact forces if the housing is dropped, can thus be mounted externally at the corners of the first surface section or the second surface section. A corner element can in this case be provided at each corner of each housing element so that the housing can be installed in different positions with the defined support of the corner elements.

Other elements provided at the corners of a housing element can serve, for example, for connecting the housing to another, for example, structurally identical, further housing. In this case, the different housings can be attached to each other with the interposition of corner elements at the corners of the housing elements facing each other and connected to each other by interlocking, for example.

A modular system of a housing of the type described above preferably comprises a group of intermediate elements with different functional devices. In this case, any intermediate element from the group of intermediate elements can be selected for mounting the housing in order to adapt the housing to a specific function or to a specific use. By, for example, identical parts, by means of which intermediate elements and the functional devices provided thereon can be provided with different functions on the housing, being used for the housing elements, a variable usability and adaptability of the housing results, with simple and inexpensive production using identical parts for at least some of the required components.

FIGS. 1 and 2 show in an overall view a housing 1 which is composed of two housing elements 10, 11 in the form of housing halves with panel elements 12 enclosed between them. The housing 1 forms, for example, an enclosure for an electrical or electronic functional module in the form of a single-board computer (in which a computer device is arranged on a single printed circuit board) or the like, and can be designed, for example, to be fixed to a support rail in order to be combined, for example, with other electrical or electronic modules in a switchgear cabinet and to take over controlling or evaluating functions, for example, within the framework of an industrial installation.

The housing elements 10, 11 each have a surface section 101, 111, each of which has a rectangular shape and is located in a plane defined by spatial directions X, Y and at the corners of which four connecting sections 100, 110 in the form of struts project along a height direction Z. Via the connecting sections 100, 110 in the form of the struts 100, 110, the housing elements 10, 11 can be attached to each other with the interposition of intermediate elements 2 and fixed to each other via fastening elements 13 in the form of screws.

In the assembled position shown in FIG. 2, the housing elements 10, 11 receive the panel elements 12 between them in such a way that the panel elements 12 form side faces of the housing 1. Openings can, for example, be introduced, by milling, for example, into the panel elements 12, via which openings plug-in connectors can, for example, be arranged on the housing 1 in order in this way to provide the functional module enclosed in the housing 1 with an electrical connection for the electrical supply and/or for data transmission.

Circuit boards of functional modules can be fastened to both housing elements 10, 11 in parallel to the plane of a surface section 101, 111 defined by the spatial directions X, Y in order in this way to enclose the functional modules in the housing 1.

In the case of the housing 1 shown in FIGS. 1 and 2, the housing elements 10, 11 are designed as identical parts of identical construction, for example made of plastic, in particular as plastic injection-molded parts. The housing elements 10, 11 each have a flat, rectangular surface section 101, 111 at the corners of which are arranged connecting sections 100, 110 in the form of the struts so that the housing elements 10, 11 can be connected to each other by attaching the connecting sections 100, 110 to each other.

The housing elements 10, 11 are connected with the interposition of intermediate elements 2. Precisely one intermediate element 2 is arranged in each case between a pair of connecting sections 100, 110 of the two housing elements 10, 11 and, when the housing 1 is mounted, is held between the connecting sections 100, 110 by interlocking and fixes the housing elements 10, 11 to each other.

Figure 5:
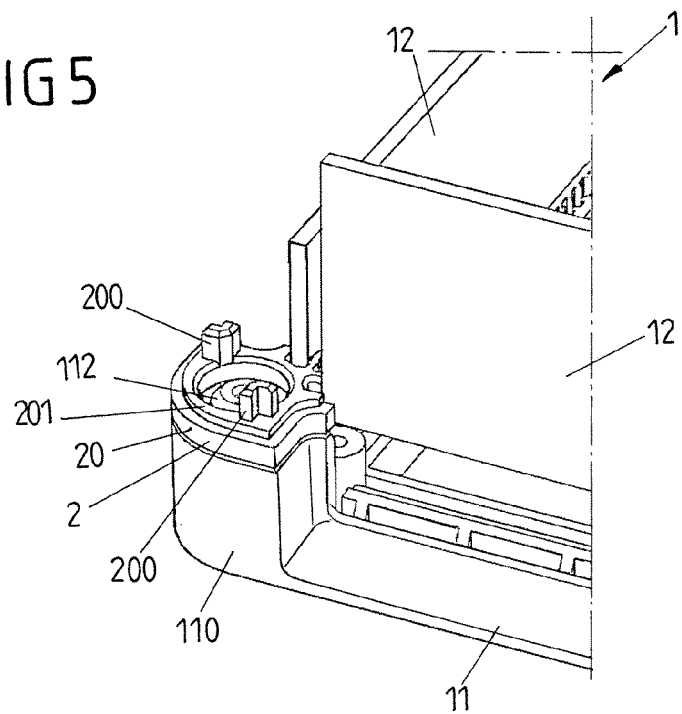
FIG. 5 shows another view of an intermediate element on a connecting section.

FIGS. 3 to 5 show enlarged views of an intermediate element 2 between two connecting sections 100, 110. The intermediate element 2 has two pairs of pins 200, 203 which, on different sides of a body 20 of the intermediate element 2, project in the direction of the two housing elements 10, 11 and, when the housing 1 is mounted, engage by interlocking in the associated connecting sections 100, 110. On one side of the body 20 of the intermediate element 2 is formed a raised section 201 which engages in a congruent recess 103 on the part of the connecting section 100 of the housing element 10 (see also FIG. 18, for example). On the averted side, the body 20 of the intermediate element 2 has, in contrast, a recess 202 into which a rib 113 on the part of the connecting section 110 of the housing element 11 engages when the intermediate element 2 is attached to the connecting section 110.

Figure 18:
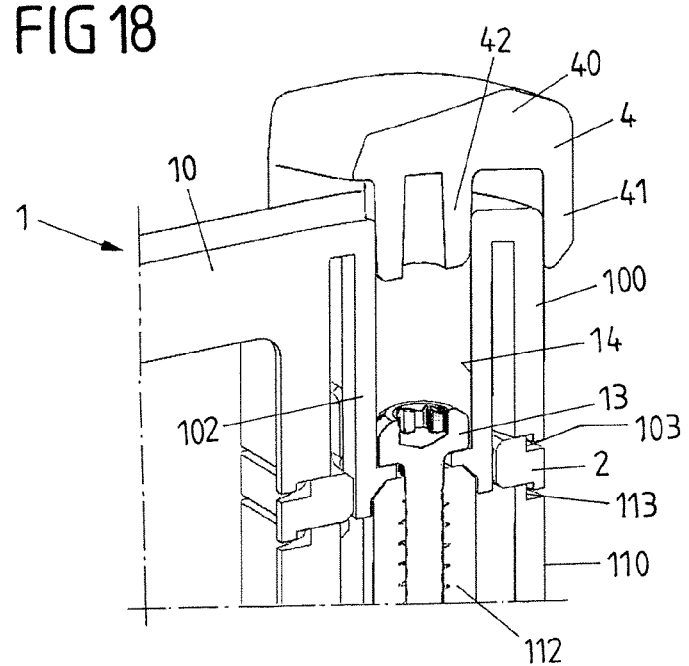
FIG. 18 shows a sectional view through the housing with a corner element arranged thereon.
Figure 19:
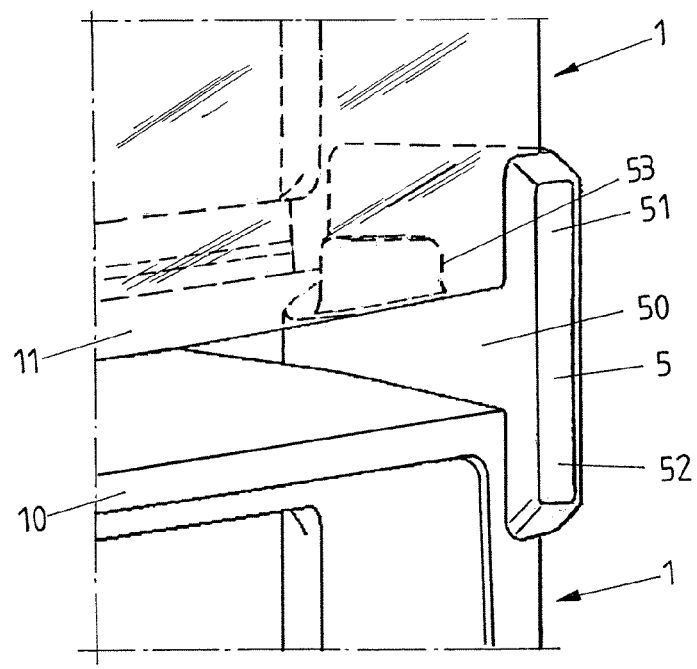
FIG. 19 shows a view of two housings connected to each other via a corner element.

For the purpose of assembly, the housing elements 10, 11 are attached to each other via their connecting sections 100, 110 with the interposition of the intermediate elements 2 and, once so attached, are fixed to each other via fastening elements 13 in the form of screws which are screwed into an opening 114 in a pin 102 of the one connecting section 100, 110 and engage in a fastening pin 112 on the other connecting element 110, 100 (see FIG. 18).

The housing elements 10, 11 are, as stated, preferably designed as identical parts. Connecting sections 100, 110 of each housing element 10, 11 which lie adjacent to each other at the edges are in this case designed differently so that the fastening elements 13 can be screwed into the connecting sections 100, 110 from different sides, as shown in FIG. 1. For example, the connecting section 110 of the lower housing element 11 shown at the front on the right in FIG. 1 is designed like the connecting section 110 shown at the bottom in FIGS. 3 to 5, while the connecting section 110 shown at the front on the left in FIG. 1 is designed like the connecting section 100 shown at the top in FIGS. 3 to 5. The associated connecting sections 100 of the upper housing element 10 are of a complementary design so that the housing elements 10 with their connecting sections 100, 110 can be suitably joined to each other with the interposition of the intermediate elements 2.

In the exemplary embodiment in FIGS. 1 to 5, the intermediate elements 2 are used exclusively for connecting the housing elements 10, 11 to each other via the connecting sections 100, 110. In this case, the intermediate elements 2 can differ in their coloring from the housing elements 10, 11 so that the intermediate elements 2 provide a design feature which can characterize the housing 1.

Figure 6:
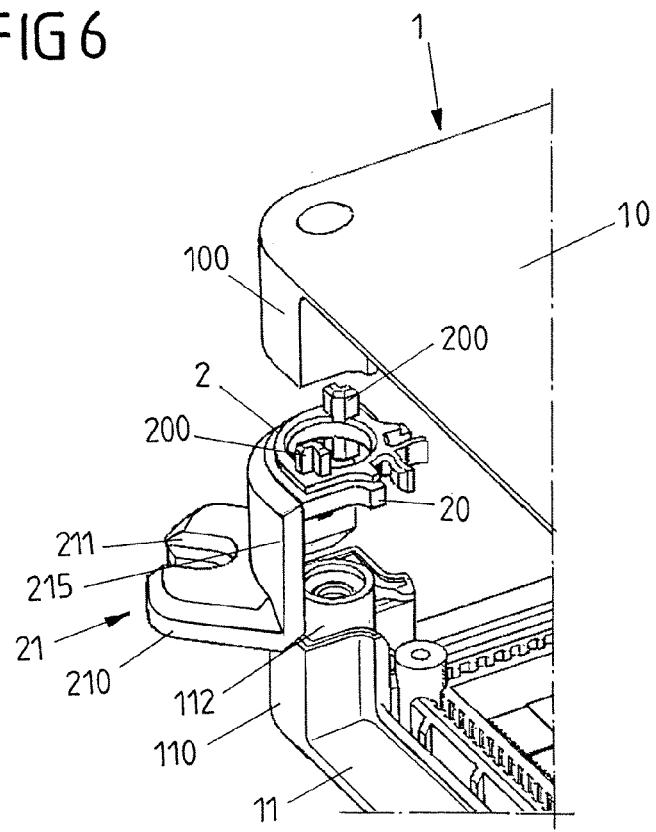
FIG. 6 shows a view of a housing with an intermediate element that has a functional device in the form of a mounting device.
Figure 7:
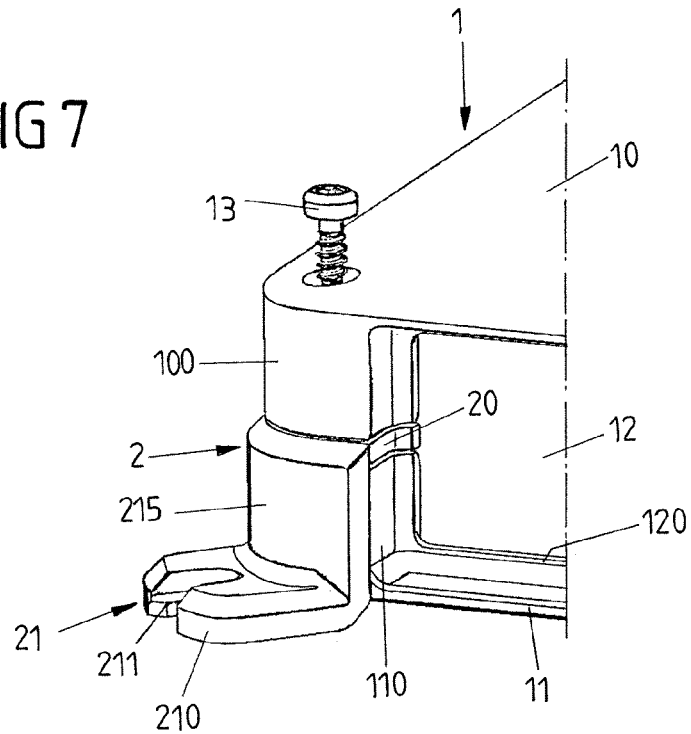
FIG. 7 shows a view of the housing with an intermediate element that has a functional device in the form of a mounting device, with the housing assembled.

In the exemplary embodiment in FIGS. 6 and 7, the intermediate elements 2 have an additional functional device in the form of a mounting device 21 for fastening the housing 1 to a wall, for example a device wall or a switchgear cabinet wall. As illustrated in FIGS. 6 and 7 on the basis of an intermediate element 2, a skirt 215 extends from the body 20 of each intermediate element 2 and points toward the surface section 111 of the housing element 11 and areally covers the associated connecting section 110 of the housing element 11 on the outside. A flange section 210 projects outwardly from the skirt 215, wherein a fastening point 211 in the form of a recess is provided on this flange section 210, to which recess a fastening element, for example in the form of a screw, can be attached in order in this way to fasten the housing 1 to the wall.

By the mounting device 21 being arranged on the intermediate element 2, the intermediate element 2 thus has a further function in addition to the function of connecting the housing elements 10, 11 to each other. The housing 1 can thus be fastened to an external structural unit via the intermediate elements 2 arranged between the housing elements 10, 11.

It is conceivable for all intermediate elements 2 to be designed as shown in FIGS. 6 and 7. However, it is also conceivable and possible for only some of the intermediate elements 2, for example two of the intermediate elements 2, to be designed with a mounting device 21 as shown in FIGS. 6 and 7.

Figure 8:
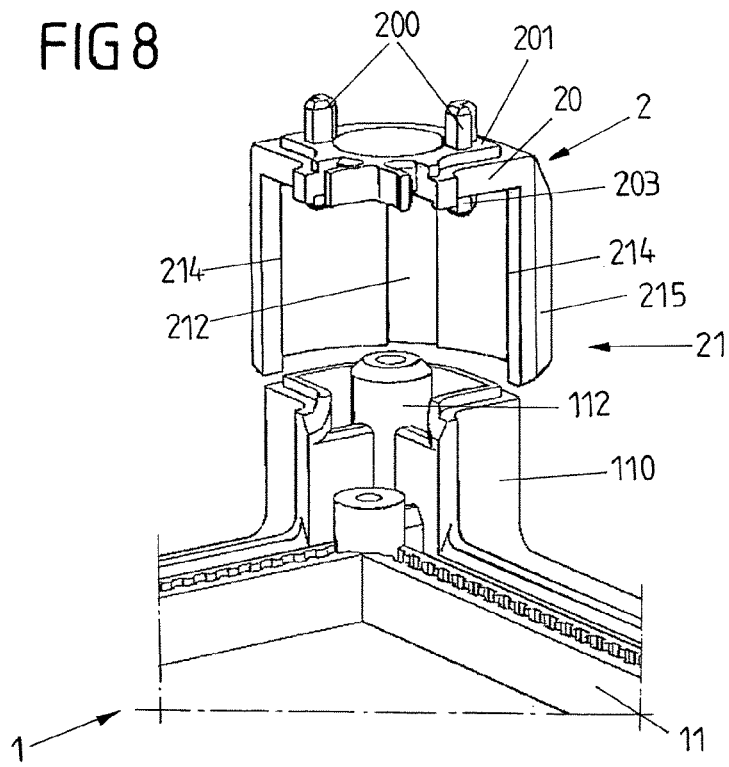
FIG. 8 shows a view of an intermediate element having a functional device in the form of another mounting device.

In the exemplary embodiment in FIGS. 8 and 9, the intermediate elements 2 have a mounting device 21 which can serve for a concealed fastening of the housing 1 to a wall 6, for example the wall of a switchgear cabinet. A skirt 215 extends from the body 20 of the intermediate element 2 on the outside of the associated connecting section 110 in the direction of the surface section 111 of the housing element 11, wherein the skirt 215 abuts with axial ribs 214 externally on the connecting section 110, and a free space in which pins 221 of a fastening element 22 can engage is created between the skirt 215 and the connecting section 110. In addition, a groove 212 is formed on the inside of the skirt 215, into which groove a latching pin 222 can be inserted in order to establish an interlocking connection between the skirt 215 and the fastening element 22 via a latching lug 223 of the latching pin 222.

In order to fasten the housing 1 to the wall 6, the fastening element 22 can be attached to the wall 6 in order to then plug the housing 1 with the skirts 215 of two intermediate elements 2 onto the pins 221, 222 of the fastening element 22 and produce an interlocking connection via the latching lugs 223 of the latching pins 222. In this case, in the fastened position of the housing 1, the latching lugs 223 engage in the latch openings 213 of the skirts 215 of the associated intermediate elements 2 (see FIG. 9).

The pins 221, 222 extend in an axially projecting manner from a body 220 of the fastening element 22 via which the fastening element 22 is to be fixed to the wall 6. It is conceivable for two fastening elements 22 to be attached to the wall 6 in order to make a connection between the housing 1 and the wall 6 via the skirts 215 of all intermediate elements 2. However, it is also conceivable and possible to use only one fastening element 22 for connecting to the skirts 215 of two intermediate elements 2.

In the exemplary embodiment in FIG. 10, a fastening element 23 with a flat panel element 230 is used, which can be fixed to the wall 6 via fastening points 234. Axially protruding pins 231, 232 are arranged at the corners of the panel element 23, wherein latching lugs 233 are provided on the middle latching pins 232 for making a latching, interlocking connection with the skirts 215 of the intermediate elements 2 of the housing 1.

Figure 11:
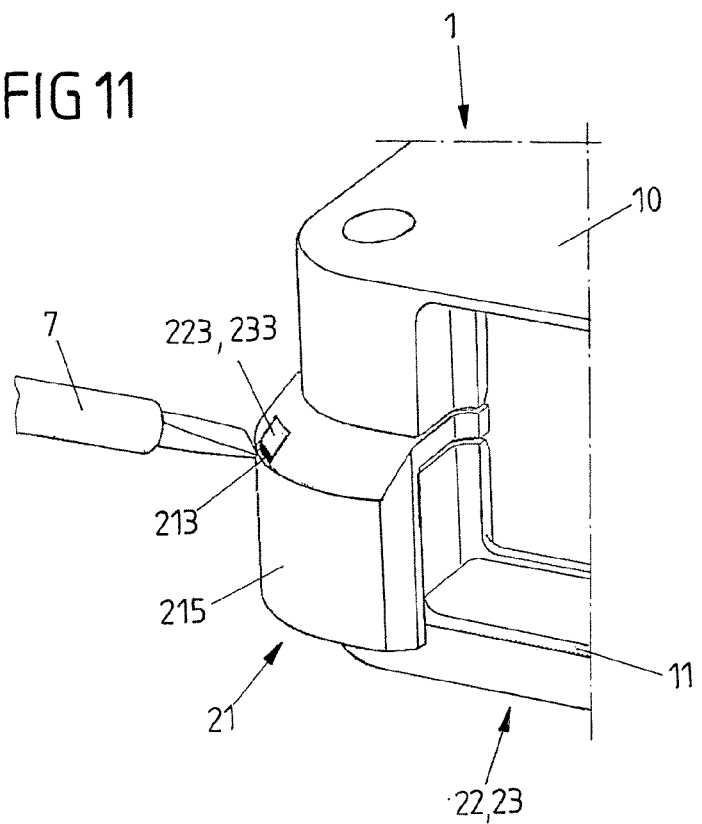
FIG. 11 shows a view of the housing during release of the housing from the fastening element.

In the exemplary embodiments in FIGS. 8 and 9 or FIG. 10, when the housing 1 is fastened, the latching lugs 223, 233 engage in the associated latch openings 213 of the skirts 215 of the intermediate elements 2, as shown in FIG. 11. In this way, an interlocking connection is established between the fastening element 22, 23, by means of which connection the housing 1 is held on the wall 6 on which the fastening element 22, 23 is mounted.

The interlocking connection can be released, for example, using a tool 7 in the form of a screwdriver, as shown in FIG. 11. For this purpose, the latching lug 223, 233 in the latch opening 113 in an intermediate element 2 can be accessed by means of the tool 7 in order in this way to release the interlocking so that the housing 1 can be pulled off the fastening element 22, 23.

Figure 12:
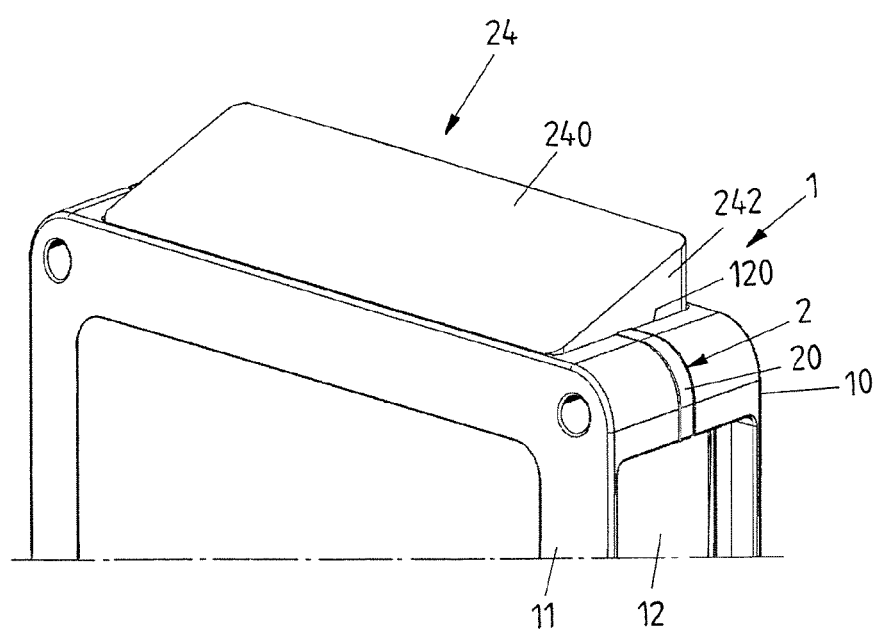
FIG. 12 shows a view of a housing with an intermediate element that has a functional device in the form of a cover element.
Figure 13A:
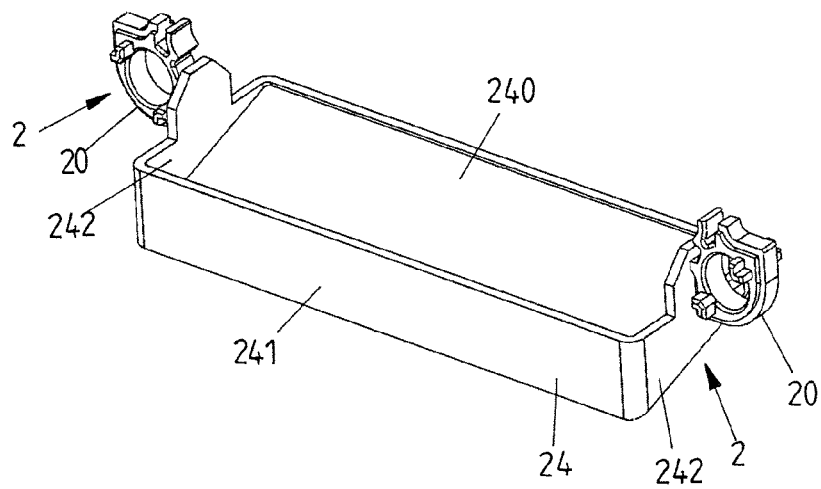
FIGS. 13A, 13B show separate views of the intermediate element.
Figure 13B:
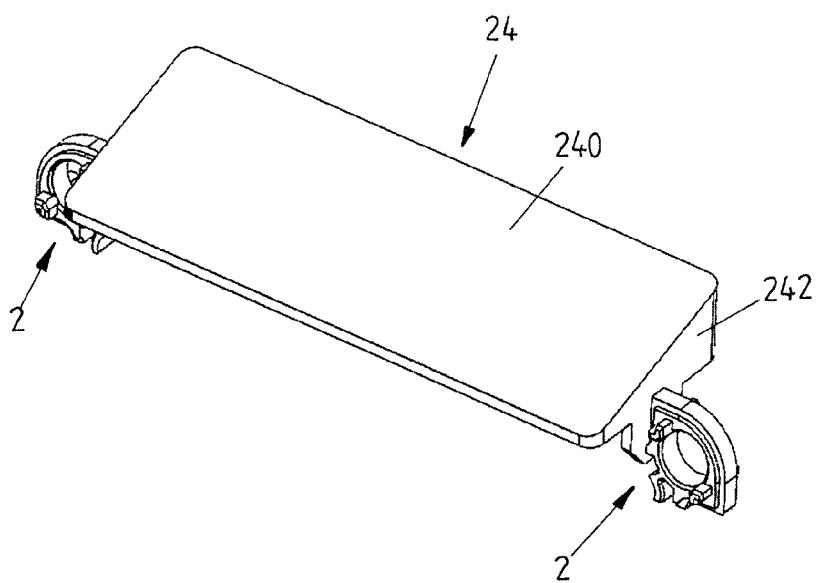

In the exemplary embodiment in FIGS. 12 and 13A, 13B, two intermediate elements 2 are connected to each other via a functional device in the form of a cover element 24. The cover element 24 is formed integrally with the bodies 20 of the intermediate elements 2 and extends between the bodies 20 in such a way that the bodies 20 of the intermediate elements 2 are arranged on both sides of the cover element 24.

The cover element 24 has a housing wall 240 which extends at an oblique angle and which is adjoined by an end wall 241 and laterally by side walls 242. The result is a box shape with an oblique wall surface 240 which can be connected to the housing elements 10, 11 via the intermediate elements 2 in such a way that the cover element 24 covers a housing opening 120 of the housing 1 toward the outside against dirt and moisture.

Figure 14:
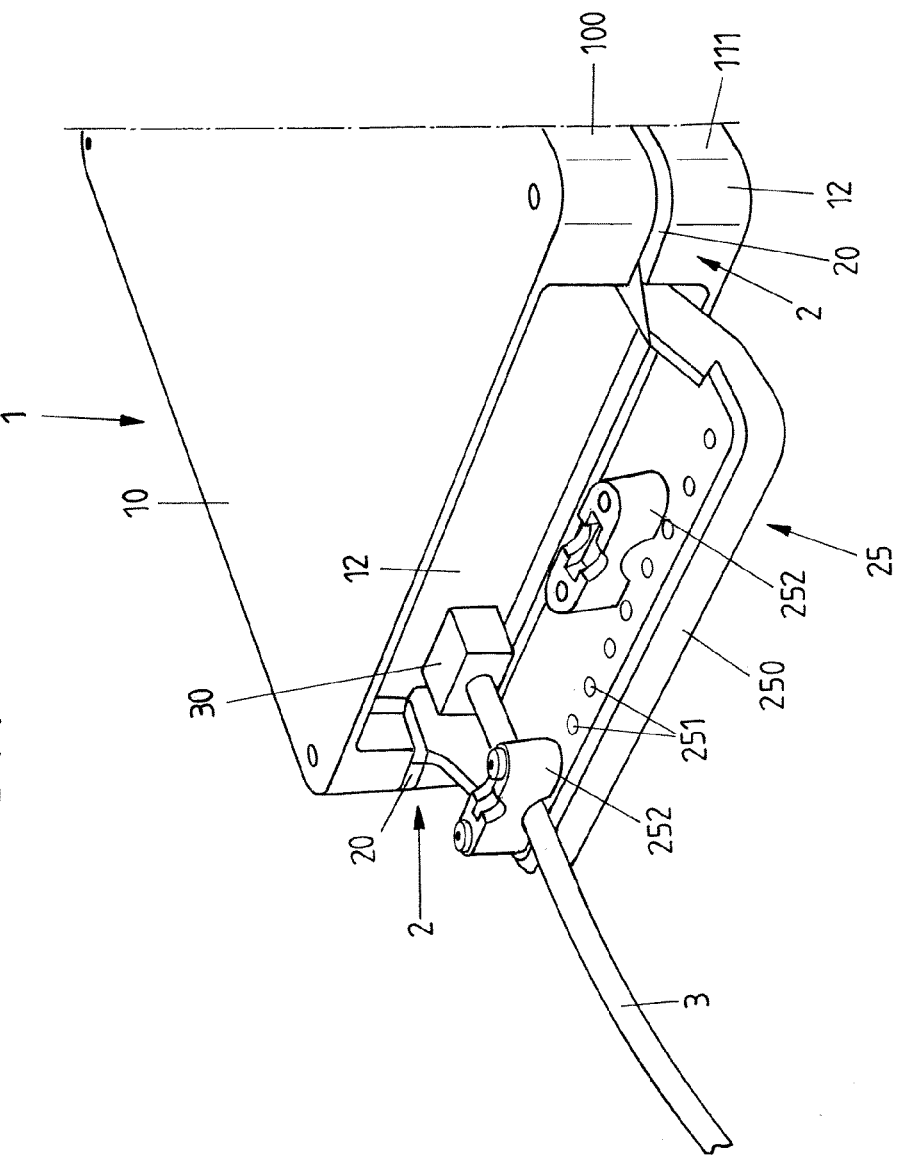
FIG. 14 shows a view of a housing with an intermediate element that has a functional device in the form of a fastening device for fixing components in the form of electrical lines to the housing.

In the exemplary embodiment in FIG. 14, a fastening body 250 of a fastening device 25 extends between bodies 20 of two intermediate elements 2, by means of which fastening device electrical lines 3 can be fixed to the housing 1 in order to provide strain relief and in particular to prevent axial tensile forces acting on the electrical lines 3 from being able to lead to loosening of the electrical lines 3 from the housing 1. On the fastening body 250, which is formed integrally with the bodies 20 of the associated intermediate elements 2, fastening points 251 are provided where fastening elements 252 for fastening electrical lines 3 by clamping can be attached to the fastening body 250.

The fastening body 250 extends in a planar manner in a plane parallel to the surface section 111 of the housing element 11. The fastening body 250 provides a rib which extends between the bodies 20 of adjacent intermediate elements 2 in front of an associated panel element 12. An electrical or electronic functional module which is enclosed in the housing 1 can be connected to external electrical or electronic functional modules via the electrical lines 3. For this purpose, a plug-in connector 30 can be arranged on an electrical line 3, it being possible to connect said plug-in connector to an associated plug-in connector on the panel element 12 in order to thereby establish an electrical contact.

In the exemplary embodiments in FIGS. 15 to 19, corner elements 4, 5 are additionally provided which can provide a defined support for the housing 1 (corner elements 4 in FIG. 15) or by means of which a connection of a housing 1 to another, further housing 1 can be made (corner elements 5 in FIG. 16).

A corner element 4 for providing a defined support can, for example, be inserted into an opening 14 of a housing element 10, 11 by means of a pin 42. The housing elements 10, 11 are fixed to each other via the opening 14 using fastening elements 13 in the form of screws. When the corner element 4 is attached to the housing element 10, 11, a skirt 41 covers a corner of the housing element 10, 11 on the outside, and a defined support for the housing 1 is provided by means of a support section 40.

By means of corner elements 5 which are arranged between housing elements 10, 11 of two housings 1, two housings 1 of the same or similar design can be placed on top of each other and connected to each other. With a pin 53, each corner element 5 in this case engages in an opening 14 in the housing element 11 of a housing 1 and, with another, opposite pin, engages in an opening in the other housing element 10 of the other housing 1 (see FIG. 19). The corners of the housing 1 are each covered on the outside by a skirt 51, 52. A body 50 comes to lie between the housing elements 10, 11 such that the housings 1 are arranged in a defined manner, for example at a defined distance from each other.

The intermediate elements 2 of the type described above are preferably made of plastic, for example as plastic injection-molded parts.

The corner elements 4, 5 can be made, for example, from a soft material, for example an elastomer or a rubber material.

The housing 1 with its housing elements 10, 11, the panel elements 12 and a group of different intermediate elements 2 can be made available as a kit. A user can thus assemble a suitable housing 1 by selecting suitable intermediate elements 2 from the group of intermediate elements 2 that is available, doing so according to his requirements and with a particular use in mind.

The idea underlying the invention is not limited to the exemplary embodiments described above but can also be realized in a completely different manner.

Other functional devices than those described here, for example a carrying means for carrying the housing, can also be provided on the intermediate element. Within the framework of such a carrying means, for example, a handle can be attached to the housing in a hinged manner in order to allow a user to grasp and carry the housing by hand.

However, quite different kinds of functional devices are also conceivable and possible, for example for providing mechanical, electrical or other functions.

Figure 20:
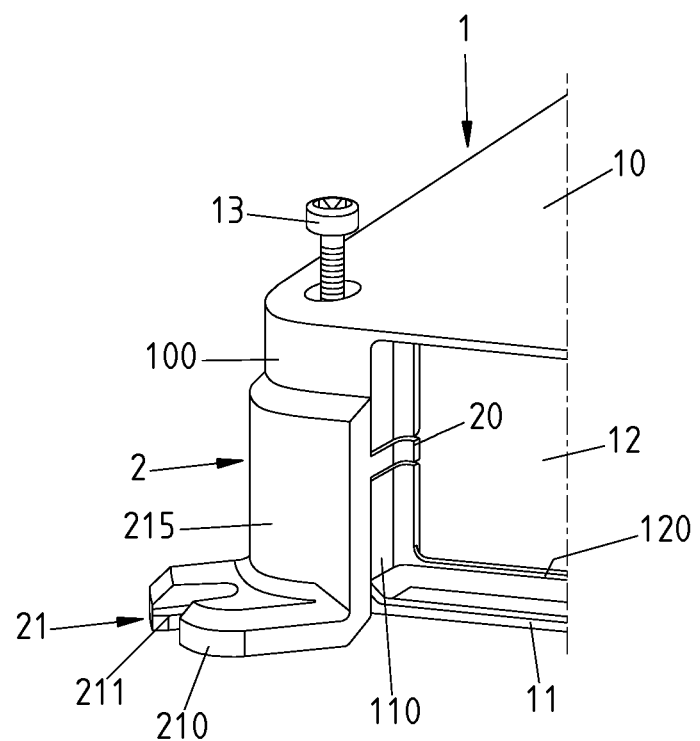
FIG. 20 shows a view of the housing with an intermediate element that has a functional device in the form of a mounting device, with the housing assembled.

In the exemplary embodiment shown in FIG. 20, and similar to FIGS. 6 and 7, the intermediate elements 2 have an additional functional device in the form of a mounting device 21 for fastening the housing 1 to a wall, for example a device wall or a switchgear cabinet wall. As illustrated in FIG. 20 on the basis of an intermediate element 2, a skirt 215 extends from the body 20 of each intermediate element 2 and points toward the surface section 111 of the housing element 11 and areally covers the associated connecting section 110 of the housing element 11 on the outside as well as areally covers the associated connecting section 100 on the outside. A flange section 210 projects outwardly from the skirt 215, wherein a fastening point 211 in the form of a recess is provided on this flange section 210, to which recess a fastening element, for example in the form of a screw, can be attached in order in this way to fasten the housing 1 to the wall.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

LIST OF REFERENCE SIGNS

1 Housing
10, 11 Housing element
100, 110 Connecting section (strut)
101, 111 Surface section
102, 112 Pin
103 Recess
113 Rib
12 Panel element
120 Opening
13 Fastening element (screw)
14 Opening
2 Intermediate element
20 Body
200 Pin
201 Raised section
202 Recess
203 Pin
21 Mounting device
210 Fastening flange
211 Fastening point
212 Groove
213 Latch opening
214 Rib
215 Skirt
22 Fastening element
220 Body
221 Pin
222 Latching pin
223 Latching element (latching lug)
23 Fastening element
230 Panel element
231 Pin
232 Latching pin
233 Latching element (latching lug)
234 Fastening point
24 Cover element
240 Housing wall
241 End wall
242 Side wall
25 Fastening device
250 Fastening body (panel element)
251 Fastening points
252 Fastening element
3 Connection line
30 Plug-in connector
4 Corner element
40 Support section
41 Skirt
42 Pin
5 Corner element
50 Body
51, 52 Skirt
53 Pin
6 Wall
7 Tool
X, Y, Z Spatial directions

The invention claimed is:

1. A housing for receiving an electrical or electronic functional module, comprising:
a first housing element having a first surface section and at least one first connecting section arranged on the first surface section;
a second housing element having a second surface section and at least one second connecting section arranged on the second surface section, the first housing element and the second housing element being connectable to each other via the at least one first connecting section and the at least one second connecting section; and
an intermediate element arrangeable between the at least one first connecting section and the at least one second connecting section in order to connect the first housing element and the second housing element, the intermediate element having at least one functional device configured to provide an additional function independent of the connection of the at least one first connecting section and the at least one second connecting section,
wherein the first housing element and the second housing element are identical parts,
wherein the at least one functional device comprises a mounting device configured to fasten the housing to a wall,
wherein the intermediate element comprises a body arrangeable between the at least one first connecting section and the at least one second connecting section, and
wherein the mounting device comprises a skirt, on an outside of the housing, that areally covers at least in sections the at least one first connecting section and the at least one second connecting section.

2. The housing according to claim 1, wherein the at least one first connecting section comprises a first strut projecting from the first surface section and/or the at least one second connecting section comprises a second strut projecting from the second surface section.

3. The housing according to claim 1, wherein the first surface section has a quadrangular shape and one said first connecting section arranged at each corner of the first surface section, and/or
wherein the second surface section has a quadrangular shape and one said second connecting section arranged at each corner of the second surface section.

4. The housing according to claim 1, further comprising panel elements which form side walls of the housing and are held between the first housing element and the second housing element by interlocking when the first housing element and second housing element are connected to each other.

5. The housing according to claim 1, wherein the body is connectable by interlocking to the at least one first connecting section and/or the at least one second connecting section.

6. The housing according to claim 1, further comprising a fastening flange projecting from the skirt, the fastening flange comprising a fastening point configured to fasten the housing to the wall.

7. The housing according to claim 1, wherein the skirt, on the outside of the housing, areally covers the at least one first connecting section or the at least one second connecting section along at least an entire height of the at least one first connecting section or the at least one second connecting section, respectively, in a height direction.

8. The housing according to claim 1, where the first surface section and the second surface section each have a rectangular shape located in a plane defined by spatial directions X and Y.

* * * * *